United States Patent
Lee et al.

(10) Patent No.: US 9,711,324 B2
(45) Date of Patent: Jul. 18, 2017

(54) INERT ATMOSPHERIC PRESSURE PRE-CHILL AND POST-HEAT

(75) Inventors: William D. Lee, Newburyport, MA (US); Steve Drummond, Merrimac, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 83 days.

(21) Appl. No.: 13/485,186

(22) Filed: May 31, 2012

(65) Prior Publication Data

US 2013/0320208 A1 Dec. 5, 2013

(51) Int. Cl.
*H01J 37/18* (2006.01)
*H01J 37/317* (2006.01)

(52) U.S. Cl.
CPC ........ *H01J 37/185* (2013.01); *H01J 37/3171* (2013.01); *H01J 2237/022* (2013.01); *H01J 2237/184* (2013.01); *H01J 2237/2001* (2013.01); *H01J 2237/31701* (2013.01)

(58) Field of Classification Search
CPC .......... H01J 37/18; H01J 37/185; H01J 37/36; H01J 37/317; H01J 37/3171; H01J 37/3479
USPC .................. 250/492.1, 492.2, 492.21, 492.3
See application file for complete search history.

(56) References Cited

U.S. PATENT DOCUMENTS

| | | | |
|---|---|---|---|
| 4,626,649 A | 12/1986 | Dupeyrat et al. | |
| 4,948,269 A | 8/1990 | Hamilton | |
| 5,134,301 A | 7/1992 | Kamata et al. | |
| H1145 H | 3/1993 | Anderson | |
| 5,636,098 A | 6/1997 | Salfelder et al. | |
| 5,754,391 A | 5/1998 | Bates | |
| 5,838,528 A | 11/1998 | Os et al. | |
| 5,975,536 A | 11/1999 | Helgeland | |
| 6,025,602 A * | 2/2000 | Rose et al. ............... | 250/492.21 |
| 6,108,189 A | 8/2000 | Weldon et al. | |
| 6,433,346 B1 | 8/2002 | Hirayanagi | |
| 6,552,892 B2 | 4/2003 | Carroll et al. | |
| 6,629,423 B1 | 10/2003 | Hirooka et al. | |
| 6,684,652 B2 | 2/2004 | Kim et al. | |

(Continued)

OTHER PUBLICATIONS

Office Action dated Dec. 20, 2012 for U.S. Appl. No. 13/150,822.

(Continued)

*Primary Examiner* — Jason McCormack
(74) *Attorney, Agent, or Firm* — Eschweiler & Potashnik, LLC (57) ABSTRACT

An ion implantation system provides ions to a workpiece positioned in a process environment of a process chamber on a sub-ambient temperature chuck. An intermediate chamber having an intermediate environment is in fluid communication with an external environment and has a cooling station and heating station for cooling and heating the workpiece. A load lock chamber is provided between the process chamber and intermediate chamber to isolate the process environment from the intermediate environment. A positive pressure source provides a dry gas within the intermediate chamber at dew point that is less than a dew point of the external environment to the intermediate chamber. The positive pressure source isolates the intermediate environment from the external environment via a flow of the dry gas from the intermediate chamber to the external environment.

20 Claims, 3 Drawing Sheets

(56) References Cited

U.S. PATENT DOCUMENTS

| | | |
|---|---|---|
| 7,033,443 B2 | 4/2006 | Kellerman et al. |
| 7,105,838 B2 | 9/2006 | Naylor-Smith et al. |
| 7,135,691 B2 | 11/2006 | Vanderpot et al. |
| 7,323,695 B2 | 1/2008 | Vanderpot et al. |
| 7,453,070 B2 | 11/2008 | Gupta et al. |
| 7,560,508 B2 | 7/2009 | Douce et al. |
| 7,560,705 B2 | 7/2009 | Eiriksson et al. |
| 7,675,048 B2 | 3/2010 | Binns et al. |
| 7,697,260 B2 | 4/2010 | Brown et al. |
| 7,935,942 B2 | 5/2011 | England et al. |
| 2001/0005595 A1 | 6/2001 | Morita et al. |
| 2002/0084424 A1 | 7/2002 | O'Carroll et al. |
| 2002/0130278 A1 | 9/2002 | Vella |
| 2003/0161088 A1 | 8/2003 | Migita |
| 2003/0221626 A1 | 12/2003 | Leavitt et al. |
| 2004/0066601 A1 | 4/2004 | Larsen |
| 2005/0121144 A1* | 6/2005 | Edo et al. ................. 156/345.32 |
| 2005/0219786 A1 | 10/2005 | Brown et al. |
| 2005/0263719 A1* | 12/2005 | Ohdaira et al. ............ 250/492.1 |
| 2005/0274910 A1 | 12/2005 | Desai et al. |
| 2006/0060259 A1 | 3/2006 | Devitt |
| 2006/0088655 A1 | 4/2006 | Collins et al. |
| 2006/0171094 A1 | 8/2006 | Muka et al. |
| 2006/0219605 A1 | 10/2006 | Devitt |
| 2006/0284116 A1 | 12/2006 | Berrian et al. |
| 2007/0109714 A1 | 5/2007 | Chung |
| 2008/0044938 A1* | 2/2008 | England et al. ................. 438/51 |
| 2008/0105836 A1 | 5/2008 | Eiriksson et al. |
| 2008/0121821 A1 | 5/2008 | Muka et al. |
| 2008/0137812 A1 | 6/2008 | Frontera et al. |
| 2008/0144251 A1 | 6/2008 | Tao et al. |
| 2008/0188011 A1 | 8/2008 | Henley |
| 2008/0218772 A1 | 9/2008 | Binns et al. |
| 2009/0067114 A1 | 3/2009 | Balan |
| 2009/0200494 A1 | 8/2009 | Hatem et al. |
| 2009/0273878 A1 | 11/2009 | Lee et al. |
| 2009/0277883 A1 | 11/2009 | Tandou et al. |
| 2010/0090413 A1 | 4/2010 | Mahoney et al. |
| 2010/0164303 A1 | 7/2010 | Veneruso |
| 2010/0171044 A1 | 7/2010 | Lee et al. |
| 2010/0181500 A1* | 7/2010 | Chang .................... C30B 31/22 250/492.21 |
| 2010/0181501 A1 | 7/2010 | Pollock |
| 2010/0301236 A1 | 12/2010 | Shieh et al. |
| 2011/0062806 A1 | 3/2011 | Ohashi et al. |
| 2011/0121207 A1 | 5/2011 | Brailove |
| 2011/0291022 A1* | 12/2011 | Lee ....................... H01J 37/185 250/453.11 |
| 2011/0291023 A1 | 12/2011 | Lee et al. |
| 2011/0291030 A1* | 12/2011 | Lee ....................... H01J 37/185 250/492.21 |

OTHER PUBLICATIONS

U.S. Appl. No. 13/116,661, filed May 26, 2011. 26 Pages.
U.S. Appl. No. 13/150,822, filed Jun. 1, 2011. 34 Pages.
U.S. Appl. No. 13/116,580, filed May 26, 2011. 25 Pages.
U.S. Appl. No. 12/944,407, filed Nov. 11, 2010. 23 Pages.
Non-Final Office Action dated Mar. 22, 2012 for U.S. Appl. No. 12/944,407. 22 Pages.
"Porous Media Technology", New Way Air Bearings, Jan. 30, 2008, reprinted from the Internet at: http://www.newwayairbearings.com/porous-media-technology , 1 page.
U.S. Statutory Invention Registration No. H1145 published on Mar. 2, 1993. 8 Pages.
Notice of Allowance dated Mar. 6, 2013 for U.S. Appl. No. 13/150,822.
Non-Final Office Action dated Sep. 12, 2012 for U.S. Appl. No. 13/116,661.
Final Office Action dated Jan. 7, 2013 for U.S. Appl. No. 13/116,661.
Non-Final Office Action dated Aug. 13, 2012 for U.S. Appl. No. 13/150,822.
Office Action dated Nov. 23, 2012 for U.S. Appl. No. 13/116,580.
Office Action dated Mar. 25, 2013 for U.S. Appl. No. 13/116,661.
Final Office Action dated Mar. 19, 2013 for U.S Appl. No. 13/116,580.
Final Office Action dated Aug. 26, 2013 for U.S. Appl. No. 13/116,661.
Notice of Allowance dated Nov. 18, 2013 for U.S. Appl. No. 13/116,661. 26 Pages.

* cited by examiner

INERT ATMOSPHERIC PRESSURE PRE-CHILL AND POST-HEAT

FIELD

The present invention relates generally to ion implantation systems and more specifically to preventing condensation from forming on a workpiece in an ion implantation system.

BACKGROUND

Electrostatic clamps or chucks (ESCs) are often utilized in the semiconductor industry for clamping workpieces or substrates during plasma-based or vacuum-based semiconductor processes such as ion implantation, etching, chemical vapor deposition (CVD), etc. Clamping capabilities of the ESCs, as well as workpiece temperature control, have proven to be quite valuable in processing semiconductor substrates or wafers, such as silicon wafers. A typical ESC, for example, comprises a dielectric layer positioned over a conductive electrode, wherein the semiconductor wafer is placed on a surface of the ESC (e.g., the wafer is placed on a surface of the dielectric layer). During semiconductor processing (e.g., ion implantation), a clamping voltage is typically applied between the wafer and the electrode, wherein the wafer is clamped against the chuck surface by electrostatic forces.

For certain ion implantation processes, cooling the workpiece via a cooling of the ESC is desirable. At colder temperatures, however, condensation can form on the workpiece, or even freezing of atmospheric water on the surface of the workpiece can occur, when the workpiece is transferred from the cold ESC in the process environment (e.g., a vacuum environment) to an external environment (e.g., a higher pressure, temperature, and humidity environment). For example, after an implantation of ions into the workpiece, the workpiece is typically transferred into a load lock chamber, and the load lock chamber is subsequently is vented. When the load lock chamber is opened to remove the workpiece therefrom, the workpiece is typically exposed to ambient atmosphere (e.g., warm, "wet" air at atmospheric pressure), wherein condensation can occur on the workpiece. The condensation can deposit particles on the workpiece, and/or leave residues on the workpiece that can have adverse effects on front side particles (e.g., on active areas), and can lead to defects and production losses.

Therefore, a need exists in the art for an apparatus, system, and method for mitigating condensation on a workpiece when transferred from a cold environment to a warmer environment.

SUMMARY

The present invention overcomes the limitations of the prior art by providing a system, apparatus, and method for abating condensation on a workpiece in a chilled ion implantation system. Accordingly, the following presents a simplified summary of the disclosure in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

In accordance with the present disclosure, an ion implantation system for implanting ions into a cold workpiece is provided. The ion implantation system, for example, comprises an ion implantation apparatus configured to provide a plurality of ions to a workpiece positioned in a process chamber, wherein the process chamber has a process environment associated therewith. In one example, a sub-ambient temperature chuck, such as a cryogenically cooled electrostatic chuck, is configured to support the workpiece within the process chamber during an exposure of the workpiece to the plurality of ions. The cryogenic chuck is further configured to cool the workpiece to a processing temperature, wherein the process temperature is below a dew point of an external environment.

According to one aspect, an intermediate chamber having an intermediate environment associated therewith is further provided in fluid communication with the external environment. The intermediate chamber, for example, comprises a cooling station configured to cool the workpiece to a first temperature and a heating station configured to heat the workpiece to a second temperature. The first temperature, for example, is associated with the process temperature, and the second temperature is associated with an external temperature of the external environment, wherein the second temperature is greater than the first temperature.

A load lock chamber is further provided, wherein the load lock chamber is operably coupled to the process chamber and the intermediate chamber. The load lock chamber is configured to isolate the process environment from the intermediate environment. The load lock chamber further comprises a workpiece support configured to support the workpiece during a transfer of the workpiece between the process chamber and the intermediate chamber.

In accordance with another aspect of the disclosure, a positive pressure source is further provided, wherein the positive pressure source is configured to provide a dry gas to the intermediate chamber. The dry gas, for example, has a dew point that is less than a dew point of the external environment. Thus, the positive pressure source, in conjunction with the intermediate chamber, generally isolates the intermediate environment from the external environment via a flow of the dry gas from the intermediate chamber to the external environment. Accordingly, the intermediate chamber provides an intermediate environment in which one or more workpieces can reside during a transfer between the external environment and the process environment. As such, an advantageous process flow of workpieces between the external environment and the process environment is provided. By the intermediate heating and cooling of the workpieces and queuing thereof within the intermediate environment, times spent in a conventional load lock chamber (e.g., where heating and/or cooling is performed within the load lock chamber), is advantageously decreased by the present disclosure.

The above summary is merely intended to give a brief overview of some features of some embodiments of the present invention, and other embodiments may comprise additional and/or different features than the ones mentioned above. In particular, this summary is not to be construed to be limiting the scope of the present application. Thus, to the accomplishment of the foregoing and related ends, the invention comprises the features hereinafter described and particularly pointed out in the claims. The following description and the annexed drawings set forth in detail certain illustrative embodiments of the invention. These embodiments are indicative, however, of a few of the various ways in which the principles of the invention may be employed.

Other objects, advantages and novel features of the invention will become apparent from the following detailed description of the invention when considered in conjunction with the drawings.

DETAILED DESCRIPTION

The present disclosure is directed generally toward a system, apparatus, and method for abating condensation on a workpiece in an ion implantation system. Accordingly, the present invention will now be described with reference to the drawings, wherein like reference numerals may be used to refer to like elements throughout. It is to be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details. Further, the scope of the invention is not intended to be limited by the embodiments or examples described hereinafter with reference to the accompanying drawings, but is intended to be only limited by the appended claims and equivalents thereof.

It is also noted that the drawings are provided to give an illustration of some aspects of embodiments of the present disclosure and therefore are to be regarded as schematic only. In particular, the elements shown in the drawings are not necessarily to scale with each other, and the placement of various elements in the drawings is chosen to provide a clear understanding of the respective embodiment and is not to be construed as necessarily being a representation of the actual relative locations of the various components in implementations according to an embodiment of the invention. Furthermore, the features of the various embodiments and examples described herein may be combined with each other unless specifically noted otherwise.

It is also to be understood that in the following description, any direct connection or coupling between functional blocks, devices, components, circuit elements or other physical or functional units shown in the drawings or described herein could also be implemented by an indirect connection or coupling. Furthermore, it is to be appreciated that functional blocks or units shown in the drawings may be implemented as separate features or circuits in one embodiment, and may also or alternatively be fully or partially implemented in a common feature or circuit in another embodiment. For example, several functional blocks may be implemented as software running on a common processor, such as a signal processor. It is further to be understood that any connection which is described as being wire-based in the following specification may also be implemented as a wireless communication, unless noted to the contrary.

Figure 1:
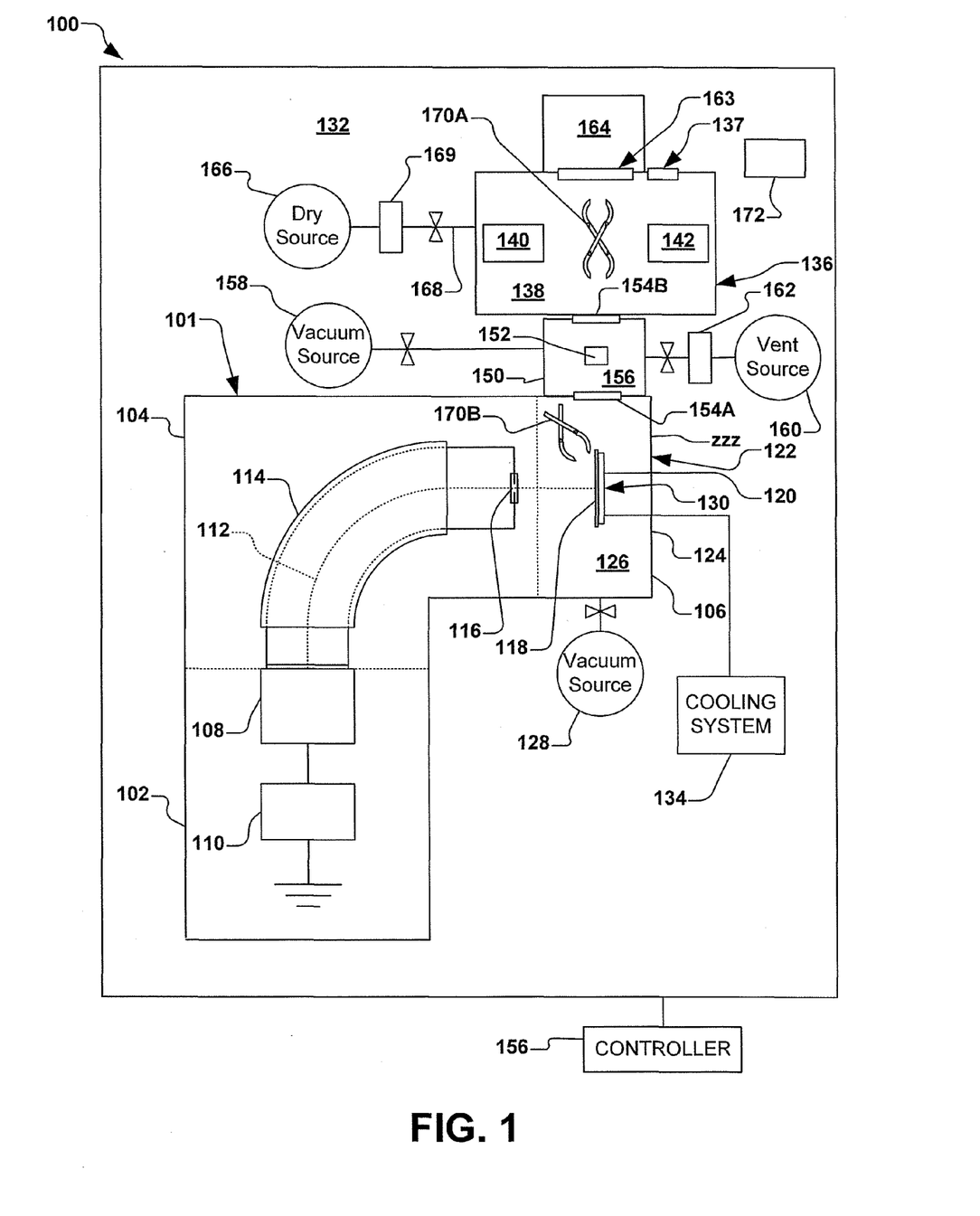
FIG. 1 is a block diagram of an exemplary vacuum system comprising an ion implantation system in accordance with several aspects of the present disclosure.

In accordance with one aspect of the present disclosure, FIG. 1 illustrates an exemplary vacuum system 100. The vacuum system 100 in the present example comprises an ion implantation system 101, however various other types of vacuum systems are also contemplated, such as plasma processing systems, or other semiconductor processing systems. The ion implantation system 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a beam-steering apparatus 114, and out an aperture 116 towards the end station 106. In the end station 106, the ion beam 112 bombards a workpiece 118 (e.g., a semiconductor such as a silicon wafer, a display panel, etc.), which is selectively clamped or mounted to a chuck 120 (e.g., an electrostatic chuck or ESC). Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplary aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

During an implantation utilizing the ion implantation system 101, energy can build up on the workpiece 118 in the form of heat, as the charged ions collide with the workpiece. Absent countermeasures, such heat can potentially warp or crack the workpiece 118, which may render the workpiece worthless (or significantly less valuable) in some implementations. The heat can further cause the dose of ions delivered to the workpiece 118 to differ from the dosage desired, which can alter functionality from what is desired. For example, if a dose of $1\times10^{17}$ atoms/cm$^2$ are desired to be implanted in an extremely thin region just below the outer surface of the workpiece 118, undesirable heating could cause the delivered ions to diffuse out from this extremely thin region such that the dosage actually achieved is less than $1\times10^{17}$ atoms/cm$^2$. In effect, the undesirable heating can "smear" the implanted charge over a larger region than desired, thereby reducing the effective dosage to less than what is desired. Other undesirable effects could also occur from the undesirable heating of the workpiece 118.

Furthermore, in some circumstances, it is desirable to not only cool the workpiece 118 during implantation to prevent heat build-up, but it may be further desirable to implant ions at a temperature below or above an ambient temperature, such as to allow for desirable amorphization of the surface of the workpiece 118 enabling ultra shallow junction formation in advanced CMOS integrated circuit device manufacturing.

Thus, in accordance with another example, the chuck 120 comprises a sub-ambient temperature chuck 130, wherein the sub-ambient temperature chuck is configured to both support and cool or otherwise maintain a predetermined temperature on the workpiece 118 within the process chamber 122 during the exposure of the workpiece to the ion beam 112. It should be noted that while the chuck 120 is referred to in the present example as being the sub-ambient temperature chuck 130, the chuck 120 can likewise comprise a super-ambient temperature chuck (not shown), wherein the super-ambient temperature chuck is configured to support and heat the workpiece 118 within the process chamber 122. The sub-ambient temperature chuck 130, for example, is an electrostatic chuck configured to cool or chill the workpiece 118 to a processing temperature that is considerably lower than an ambient or atmospheric temperature of the surroundings or external environment 132 (e.g., also called an "atmospheric environment"). Likewise, in a case where the chuck 120 comprises the above-described super-ambient temperature chuck, the super-ambient temperature chuck may comprise an electrostatic chuck configured to heat the workpiece 118 to a processing temperature that is considerably higher than the ambient or atmospheric temperature of the surroundings or external environment 132. A cooling system 134 may be further provided, wherein, in another example, the cooling system is configured to cool or chill the sub-ambient temperature chuck 130, and thus, the workpiece 118 residing thereon, to the processing temperature. In another example, and in a similar manner, a heating system (not shown) may be further provided in the case of a super-ambient temperature chuck, wherein the heating system is configured to heat the super-ambient temperature chuck and workpiece 118 residing thereon to the processing temperature.

In some exemplary operations of the vacuum system 100, the processing temperature is below the ambient dew point (e.g., 8 degrees C., also called dew point temperature) of the external environment 132, such as a processing temperature of approximately −40 degrees C. In such an operation, since the processing temperature is significantly lower than the dew point temperature of the external environment 132, without warming of the workpiece 118 prior to exposure to the external environment, condensation may form thereon, thus potentially deleteriously affecting the workpiece, as will be discussed in greater detail hereafter.

Thus, in accordance with the present disclosure, an intermediate chamber 136 is further provided, wherein the intermediate chamber is in fluid communication with the external environment 132, such as through one or more vent ports 137. The intermediate chamber further has an intermediate environment 138 associated therewith, as will be discussed in further detail infra. The intermediate chamber 136 in the present example further comprises a cooling station 140 configured to cool the workpiece 118 to a first temperature and a heating station 142 configured to heat the workpiece to a second temperature.

Figure 2:
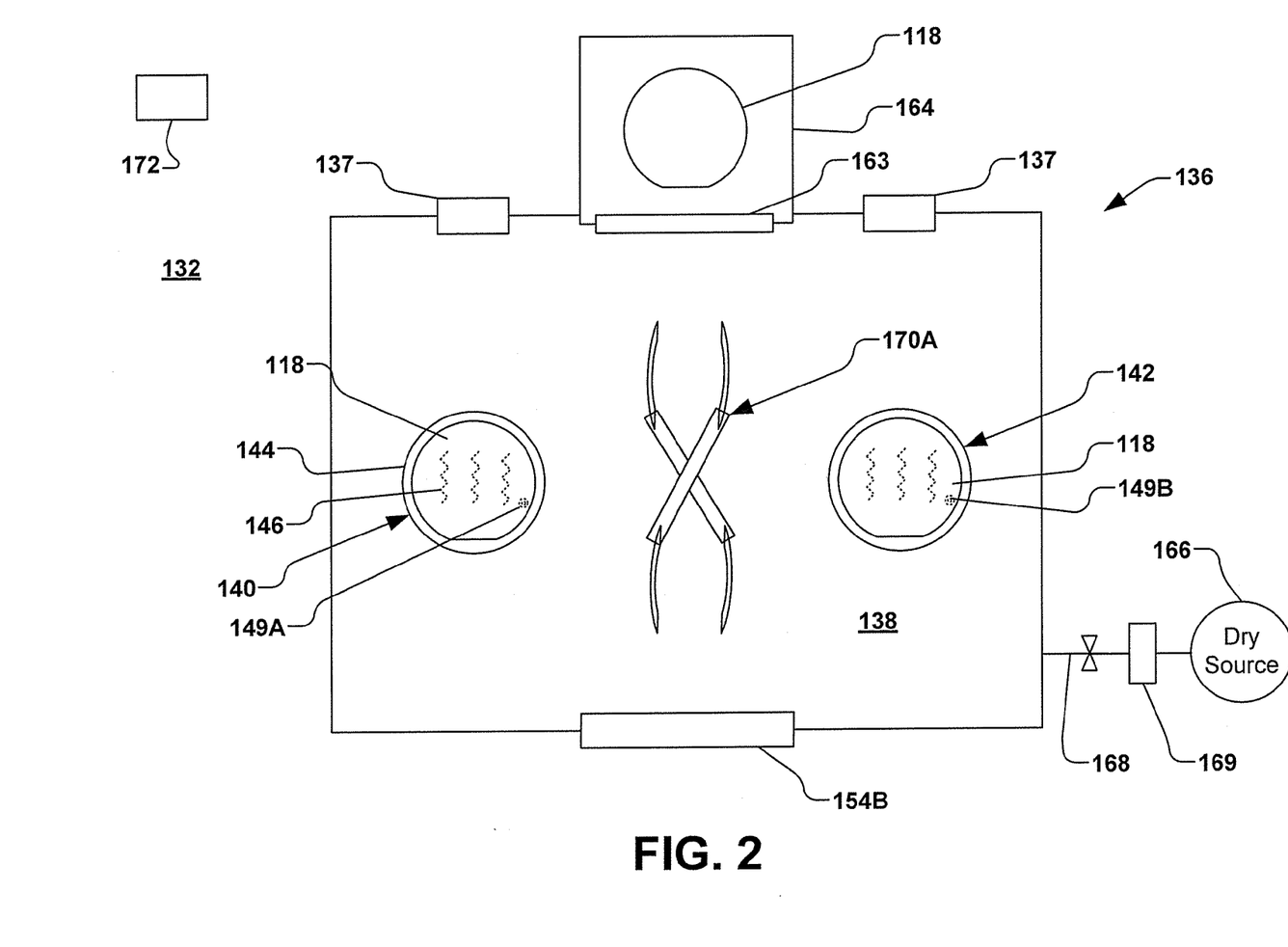
FIG. 2 is a block diagram of an exemplary intermediate chamber in relation to an exemplary ion implantation system according to another aspect of the disclosure.

The intermediate chamber 136 is illustrated in greater detail in FIG. 2, wherein the cooling station 140, for example, comprises a cooling plate 144 configured to support the workpiece 118 and to cool the workpiece to the first temperature. The cooling plate 144, for example, comprises a cooling element 146 comprising of one or more of a Peltier cooler, an expansion chamber, a cryogenic head, and a circulatory refrigeration loop configured to selectively cool or chill the workpiece 118. The heating station 142, for example, comprises a heating station support 148 configured to support and heat the workpiece 118. The heating station support 148, for example, comprises one or more of a hot plate, a heat lamp, a hot gas source, and a microwave source.

It should be noted that while both a cooling station 140 and a heating station 142 are described as being within the intermediate chamber 136, it is contemplated that one or both of the cooling station and heating station may be omitted and/or replaced with a workpiece support (not shown) configured to support the workpiece 118 without active heating and/or cooling thereof. Alternatively, additional cooling stations 140 and heating stations 142 may be provided within the intermediate chamber 136 for additional throughput efficiencies, as will be discussed hereafter. Further, according to another example, the cooling station 140 and heating station 142 are generally isolated from one another within the intermediate chamber, such as being separated by a distance, a shroud, or other apparatus or feature that minimizes heat transfer between the cooling station and heating station.

According to another example, as illustrated in FIG. 2, the intermediate chamber 136 further comprises one or more workpiece temperature monitoring devices 149A, 149B associated with one or more of the cooling station 140 and heating station 142. The one or more workpiece temperature monitoring devices 149A, 149B are configured to measure a temperature of the workpiece 118 residing on the respective cooling station 140 and heating station 142, thus monitoring the temperature of the workpiece during cooling and heating thereof, and improving process efficiencies.

In accordance with another aspect, referring again to FIG. 1, a load lock chamber 150 is further operably coupled to the process chamber 122 and the intermediate chamber 136, wherein the load lock chamber is configured to isolate the process environment 126 from the intermediate environment 138. The load lock chamber 150 further comprises a workpiece support 152 configured to support the workpiece 118 during a transfer of the workpiece between the process chamber 122 and the intermediate chamber 136. The workpiece support 152, for example, may be configured to further heat and/or cool the workpiece 118 when the workpiece resides on the workpiece support. A plurality of load lock doors 154A, 154B operably couple the load lock chamber 150 to the respective process chamber 122 and the intermediate chamber 136, therein selectively fluidly coupling the load lock chamber to the process chamber and intermediate chamber and defining a load lock chamber environment 156.

Accordingly, the load lock chamber 150 maintains the process environment 126 (e.g., a dry environment or a vacuum environment) within the vacuum system 100 via a variation in of the load lock chamber environment 156. A pressure within the load lock chamber 150, for example, is configured to vary between the vacuum associated with the process environment 126 and an intermediate pressure associated with the intermediate environment 138, such as via a load lock chamber vacuum source 158 and a load lock chamber vent source 160. A load lock heater 162 can be optionally provided in conjunction with the vent source 160, wherein gases associated with the vent source are heated during a venting of the load lock chamber 150. Accordingly, the load lock chamber 150 permits a transfer of the workpiece 118 into and out of the ion implantation system 101 without compromising the quality of vacuum (e.g., the process environment 126) within the ion implantation system.

Further, in accordance with another exemplary aspect, the intermediate environment 138 of the intermediate chamber 136 is further selectively isolated from the external environment by a door 163, wherein the door is configured to selectively operably couple a workpiece transport container 164 (e.g., a FOUP) to the intermediate chamber. The workpiece transport container 164, for example, is configured to transfer a plurality of workpieces 118 in the atmospheric environment 134, such as to and from the vacuum system 100. It should be noted that such in-air handling of the workpiece 118 exposes the workpiece to moisture of the atmospheric environment 134.

The inventors appreciate that ion implantations that are performed at chilled temperatures (e.g., any temperature below the dew point temperature of the external environment 132), for example, can cause condensation to form on the workpiece 118 if the workpiece is transferred from the process environment 126 within the ion implantation system 101 to the external environment when the workpiece is cooler than the dew point temperature of the external environment. If the temperature of the workpiece 118 is below the freezing point of water, for example, the workpiece can develop frost (e.g., deposited frozen water vapor) upon being exposed to ambient water (e.g., humidity) in the ambient air of the external environment 132.

Thus, in accordance with another aspect of the disclosure, a positive pressure source 166 is operably coupled to the intermediate chamber 136, wherein the positive pressure source is configured to provide a dry gas 168 to the intermediate chamber at an intermediate pressure that is greater than atmospheric pressure associated with the external environment 132. The dry gas 168, for example, has a dew point that is less than the temperature of the workpiece 118 (e.g., also called the wafer temperature). In another example, the dry gas 168 has a dew point that is less than a dew point of the external environment 132. The dry gas 168 provided by the positive pressure source 166 may be further heated by a dry gas heater 169. Accordingly, the positive pressure source 166 generally isolates the intermediate environment 138 from the external environment 132 via a flow of the dry gas 168 from the intermediate chamber 136 to the external environment due to a pressure differential between the intermediate environment and the external environment.

In one example, the dry gas 168 comprises an inert gas, such as dry nitrogen. As such, the positive pressure source 166 providing the dry gas 168 may comprise pressure tanks or vessels (not shown) for holding/storing the dry gas 168. Alternatively, the dry gas 168 comprises substantially desiccated atmospheric gas, wherein the positive pressure source 166 comprises one or more desiccators (not shown) or other apparatus to generally remove humidity from the atmospheric gas associated with the external environment 132. It is believed that desiccated atmospheric gas may be advantageous as opposed to commercial gases delivered in pressure vessels, in that desiccated atmospheric gas may be more cost-efficient than other dry gases delivered in pressure vessels, as atmospheric gas is readily available, and would not require additional handling of pressure vessels.

In yet another example, a transfer apparatus 170A is configured to transfer the workpiece 118 within the intermediate environment 138. For example, the transfer apparatus 170A is configured to remove and/or return the workpiece 118 from and/or to the workpiece transport container 164. The transfer apparatus 170A is further configured to transfer the workpiece 118 to and/or from one or more of the cooling station 140 and heating station 142. Further, the transfer apparatus 170A is configured to transfer the workpiece 118 to and/or from the load lock chamber 150. The transference of the workpiece 118 within the intermediate chamber 136 thus transfers the workpiece through and within the intermediate environment 138. Likewise, another transfer apparatus 170B is configured to transfer the workpiece 118 within the process environment 126, such as to and from the chuck 120 and the load lock chamber 150.

According to another aspect, as illustrated in FIG. 1, a secondary monitoring device 172 is provided, wherein the secondary monitoring device is configured to measure at least the external temperature of the external environment 132. As such, a controller 174 is further provided and configured to determine a temperature of the workpiece 118 at which condensation will not form on the workpiece when the workpiece is transferred from the intermediate chamber 136 to the external environment 132. For example, the determination is made based, at least in part, on data from the one or more workpiece temperature monitoring devices 149A, 149B and the secondary temperature monitoring device 172.

An exemplary flow scheme or transference of workpieces 118 in association with the vacuum system 100 will now be briefly discussed in order to provide one of many operational examples of an operation of the vacuum system. It should be noted that the present disclosure is not limited to the exemplary flow provided, and that various other transferences of workpieces 118 into, out of, and within the vacuum system are contemplated as falling within the scope of the present disclosure.

In one exemplary workpiece flow, the workpiece 118 is transferred out of the workpiece transport container 164 to a pre-aligner station (not shown), wherein the workpiece is aligned in accordance with process requirements. The workpiece 118 is then transferred to one of the cooling station 140 and heating station 142 within the intermediate chamber 136, depending on whether a sub-ambient or super-ambient implantation is desired. For example, in a sub-ambient implantation (e.g., an implantation at a temperature below ambient temperature), the workpiece 118 is transferred to the cooling station 140, wherein the workpiece is pre-chilled to approximately the processing temperature. Once cooled via the cooling station 140 (or heated via the heating station 142) to approximately the processing temperature, the workpiece 118 is transferred into the load lock chamber 150, wherein the load lock chamber is accordingly evacuated. Once evacuated, the workpiece 118 is transferred from the load lock chamber 150 to the chuck 120 for appropriate implantation of ions according to process requirements.

Once the implantation is complete, the workpiece 118 is removed from the chuck 120 and again placed into the load lock chamber 150, wherein the load lock chamber is vented. The workpiece 118 is then transferred out of the load lock chamber 150 to one of the cooling station 140 and heating station 142 within the intermediate chamber 136, again depending on whether a sub-ambient or super-ambient implantation is desired. In the above sub-ambient implantation example, the workpiece 118 is transferred to the heating station 142, wherein in the present example, the workpiece is heated to a temperature greater than the dew point temperature of the external environment 132, as described above. Once above the dew point temperature of the external environment 132, for example, the workpiece 118 is transferred back to the workpiece transport container 164.

Figure 3:
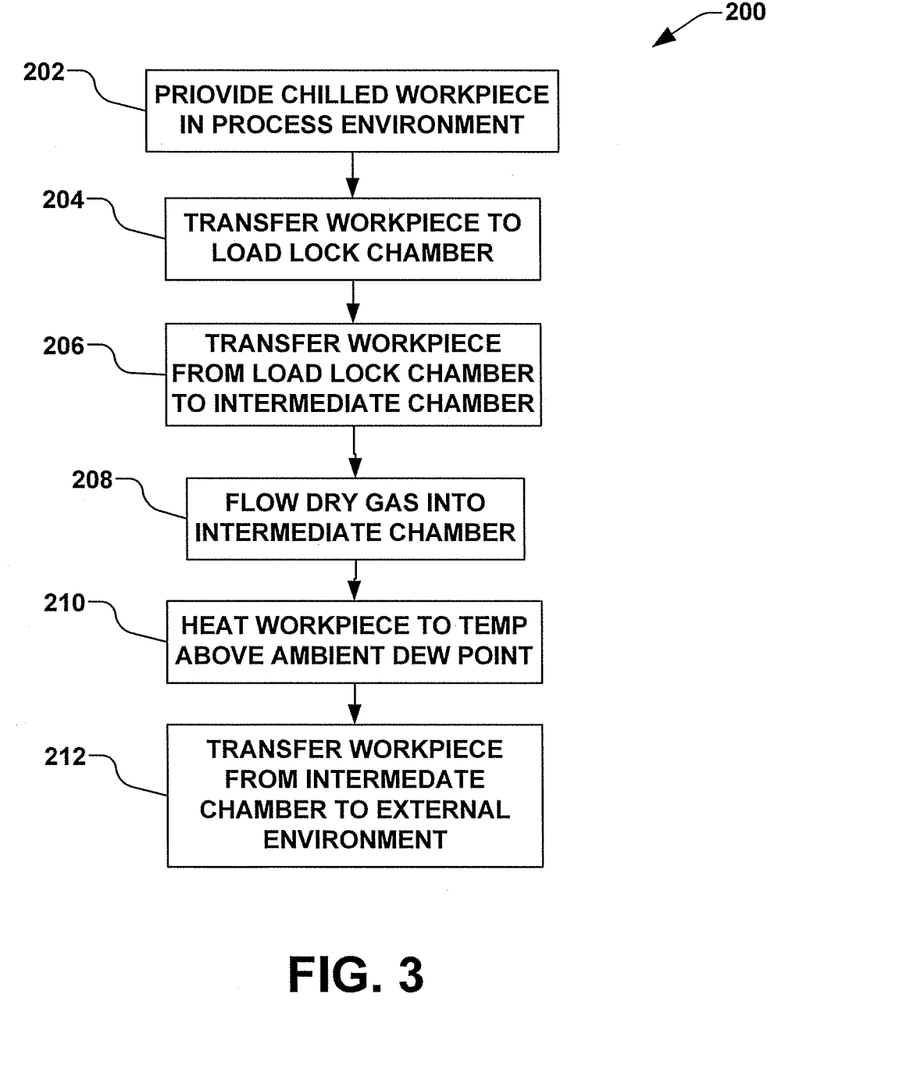
FIG. 3 illustrates a methodology for abating condensation in a cold implantation of ions into a workpiece, in accordance with still another aspect.

In accordance with another exemplary aspect of the invention, FIG. 3 illustrates an exemplary method 200 is provided for preventing condensation on a workpiece. It should be noted that while exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

The method 200 of FIG. 4 begins at act 202, wherein a workpiece is provided in a process environment of a process chamber in a cold implant ion implantation system. The workpiece, for example, is at a first temperature that is below an ambient dew point of an external environment. In act 204, the workpiece is transferred from the process chamber to a load lock chamber, wherein a pressure is raised from a process pressure associated with the process chamber to an external pressure associated with the external environment. In act 206, the workpiece is transferred from the load lock chamber to an intermediate chamber having an intermediate environment associated therewith. In accordance with one example of the present disclosure, the intermediate chamber is in fluid communication with the external environment.

In act 208, a dry gas is flowed into the intermediate chamber. A positive pressure differential is thus established within the intermediate chamber with respect to the external environment. In one example, the flow of dry gas is allowed to escape the intermediate chamber by one or more vents associated with the intermediate chamber. In act 210, the workpiece is heated in the intermediate chamber to a second temperature that is above the ambient dew point of the external environment. Then, in act 212, the workpiece is removed from the intermediate chamber and brought into the external environment, wherein condensation on the workpiece is abated by bringing the temperature of the workpiece to above the ambient dew point, as performed in act 210.

In accordance with one example, providing the workpiece in the process environment of a process chamber comprises transferring the workpiece from the load lock chamber to the process chamber. Prior to such transfer, the workpiece is cooled to the first temperature within the intermediate chamber, and the workpiece is transferred from the intermediate chamber to the load lock chamber, wherein a pressure is lowered from the external pressure to the process pressure.

The present disclosure thus provides for an increase in productivity of the ion implantation system 101 of FIG. 1. By heating and cooling the workpiece 118 in the intermediate chamber 136 that is surrounded by dry gas, time spent within the load lock chamber 150 is minimized, and throughput is maximized Although the invention has been shown and described with respect to a certain embodiment or embodiments, it should be noted that the above-described embodiments serve only as examples for implementations of some embodiments of the present invention, and the application of the present invention is not restricted to these embodiments. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Accordingly, the present invention is not to be limited to the above-described embodiments, but is intended to be limited only by the appended claims and equivalents thereof.

The invention claimed is:

1. An ion implantation system, comprising:
   a process chamber having a process environment associated therewith;
   an ion implantation apparatus configured to provide a plurality of ions to a workpiece positioned in the process chamber;
   a sub-ambient temperature chuck configured to support the workpiece within the process chamber during an exposure of the workpiece to the plurality of ions, wherein the sub-ambient temperature chuck is further configured to cool the workpiece to a processing temperature;
   an intermediate chamber having an intermediate environment associated therewith, wherein the intermediate chamber is in fluid communication with an external environment, and wherein the intermediate chamber comprises a cooling station configured to cool the workpiece to a first temperature and a heating station configured to heat the workpiece to a second temperature;
   a load lock chamber operably coupled to the process chamber and the intermediate chamber, wherein the load lock chamber is configured to isolate the process environment from the intermediate environment, and wherein the load lock chamber comprises a workpiece support configured to support the workpiece during a transfer of the workpiece between the process chamber and the intermediate chamber; and
   a positive pressure source configured to provide a dry gas to the intermediate chamber at an intermediate pressure that is greater than atmospheric pressure, wherein the dry gas has a dew point that is less than a dew point of the external environment, and wherein the positive pressure source generally isolates the intermediate environment from the external environment via a flow of the dry gas from the intermediate chamber to the external environment.

2. The ion implantation system of claim 1, wherein the dry gas comprises an inert gas.

3. The ion implantation system of claim 2, wherein the inert gas comprises dry nitrogen.

4. The ion implantation system of claim 1, wherein the dry gas comprises substantially desiccated atmospheric gas.

5. The ion implantation system of claim 1, wherein the cooling station comprises a cooling plate configured to support the workpiece and to cool the workpiece to the first temperature.

6. The ion implantation system of claim 1, further comprising a vacuum pump, wherein the process chamber comprises a vacuum chamber, and wherein the vacuum pump is configured to substantially evacuate the process chamber.

7. The ion implantation system of claim 1, wherein the intermediate chamber comprises a door, wherein the door selectively isolates the intermediate chamber from the external environment.

8. The ion implantation system of claim 1, further comprising one or more transfer apparatuses configured to transfer the workpiece between the process chamber, load lock chamber, intermediate chamber, and external environment.

9. The ion implantation system of claim 1, wherein the ion implantation apparatus comprises:
an ion source configured to form an ion beam;
a beamline assembly configured to mass analyze the ion beam; and
an end station comprising the process chamber.

10. The ion implantation system of claim 1, wherein the sub-ambient temperature chuck comprises an electrostatic chuck configured to chill the workpiece, wherein the processing temperature is below the dew point of the atmosphere of the external environment.

11. The ion implantation system of claim 1, wherein the heating station and cooling station are generally isolated from one another within the intermediate chamber.

12. The ion implantation system of claim 1, wherein the intermediate chamber further comprises one or more workpiece temperature monitoring devices associated with one or more of the heating station and cooling station.

13. The ion implantation system of claim 12, further comprising:
a secondary monitoring device, wherein the secondary monitoring device is configured to measure at least an external temperature of the external environment; and
a controller configured to determine a temperature of the workpiece at which condensation will not form on the workpiece when the workpiece is transferred from the intermediate chamber to the external environment, wherein the determination is made based, at least in part, on data from the one or more workpiece temperature monitoring devices and the secondary temperature monitoring device.

14. The ion implantation system of claim 1, further comprising a dry gas heater configured to heat the dry gas upstream of the intermediate chamber.

15. The ion implantation system of claim 14, wherein the intermediate pressure is greater than atmospheric pressure.

16. A method for preventing condensation on a workpiece, the method comprising:
providing a workpiece in a process environment of a process chamber in a cold implant ion implantation system, wherein the workpiece is at a first temperature that is below an ambient dew point of an external environment;
transferring the workpiece from the process chamber to a load lock chamber, wherein a pressure is raised from a process pressure associated with the process chamber to an external pressure associated with the external environment;
transferring the workpiece from the load lock chamber to an intermediate chamber having an intermediate environment associated therewith, wherein the intermediate chamber is in fluid communication with the external environment;
flowing a dry gas into the intermediate chamber at an intermediate pressure that is greater than atmospheric pressure, therein providing a positive pressure differential within the intermediate chamber with respect to the external environment; and
heating the workpiece in the intermediate chamber to a second temperature that is above the ambient dew point of the external environment.

17. The method of claim 16, wherein providing the workpiece in the process environment of a process chamber comprises transferring the workpiece from the load lock chamber to the process chamber, the method further comprising:
cooling the workpiece to the first temperature within the intermediate chamber; and
transferring the workpiece from the intermediate chamber to the load lock chamber, therein wherein a pressure is lowered from the external pressure to the process pressure.

18. The method of claim 16, wherein flowing the dry gas into the intermediate chamber comprises flowing one or more of an inert gas, dry nitrogen, and a substantially desiccated atmospheric gas into the intermediate chamber.

19. The method of claim 16, further comprising heating the dry gas prior to flowing the dry gas into the intermediate chamber.

20. An ion implantation system, comprising:
a process chamber having a process environment associated therewith;
an ion implantation apparatus configured to provide a plurality of ions to a workpiece positioned in the process chamber;
a sub-ambient temperature chuck configured to support the workpiece within the process chamber during an exposure of the workpiece to the plurality of ions, wherein the sub-ambient temperature chuck is further configured to cool the workpiece to a processing temperature;
an intermediate chamber having an intermediate environment associated therewith, wherein the intermediate chamber is in fluid communication with an external environment, and wherein the intermediate chamber comprises a cooling station configured to cool the workpiece to a first temperature and a heating station configured to heat the workpiece to a second temperature;
a load lock chamber operably coupled to the process chamber and the intermediate chamber, wherein the load lock chamber is configured to isolate the process environment from the intermediate environment, and wherein the load lock chamber comprises a workpiece support configured to support the workpiece during a transfer of the workpiece between the process chamber and the intermediate chamber;
a positive pressure source configured to provide a dry gas to the intermediate chamber; and
a dry gas heater configured to heat the dry gas upstream of the intermediate chamber, wherein the dry gas has a dew point that is less than a dew point of the external environment, and wherein the positive pressure source generally isolates the intermediate environment from the external environment via a flow of the dry gas from the intermediate chamber to the external environment and a pressure differential between the intermediate environment and the external environment.

* * * * *